United States Patent
Park et al.

(10) Patent No.: US 7,316,537 B2
(45) Date of Patent: Jan. 8, 2008

(54) SUBSTRATE TRANSPORT APPARATUS

(75) Inventors: Joo-Jib Park, Seoul (KR); Jeong-Yeol Choi, Cheonan-si (KR)

(73) Assignee: Semes Co., Ltd., Chonan-Shi, Chungcheongnamdo ( * ) Notice: Subject to any disclaimer, the term of this patent is extended or adjusted under 35 U.S.C. 154(b) by 233 days.

(21) Appl. No.: 11/135,398

(22) Filed: May 24, 2005

(65) Prior Publication Data

US 2006/0037499 A1    Feb. 23, 2006

(30) Foreign Application Priority Data

Aug. 12, 2004   (KR) ..................... 10-2004-0063502

(51) Int. Cl.
*B25J 18/04* (2006.01)
(52) U.S. Cl. .............................. 414/744.1; 414/749.1; 414/749.5
(58) Field of Classification Search ............. 414/744.5, 414/783, 749.1, 749.5, 744.1
See application file for complete search history.

(56) References Cited

U.S. PATENT DOCUMENTS 6,305,898 B1 * 10/2001 Yamagishi et al. ...... 414/744.5

FOREIGN PATENT DOCUMENTS

| JP | 08-227931 | 9/1996 |
|---|---|---|
| JP | 11-106044 | 4/1999 |
| JP | 2004-119554 | 4/2004 |
| KR | 20-0252735 | 10/2001 |
| KR | 10-0331157 | 3/2002 |
| KR | 2003-0095109 | 12/2003 |
| KR | 2003-0097286 | 12/2003 |

* cited by examiner

*Primary Examiner*—Donald Underwood
(74) *Attorney, Agent, or Firm*—Harness, Dickey & Pierce, P.L.C.

(57) ABSTRACT

A substrate transport apparatus is provided for stably transporting a substrate and sensing a receiving state of the substrate. The substrate transport apparatus includes a grip member for gripping a substrate placed on the pocket part of the hand when a hand returns to a groove position from a pickup position. The grip member may include a pusher and an elastic member. The pusher has a curved section contacting the edge of a substrate and is mounted on the base to move in the same direction as the at least one hand, and the elastic member supplies an elastic force for enabling the pusher to laterally press the edge of the substrate.

9 Claims, 12 Drawing Sheets

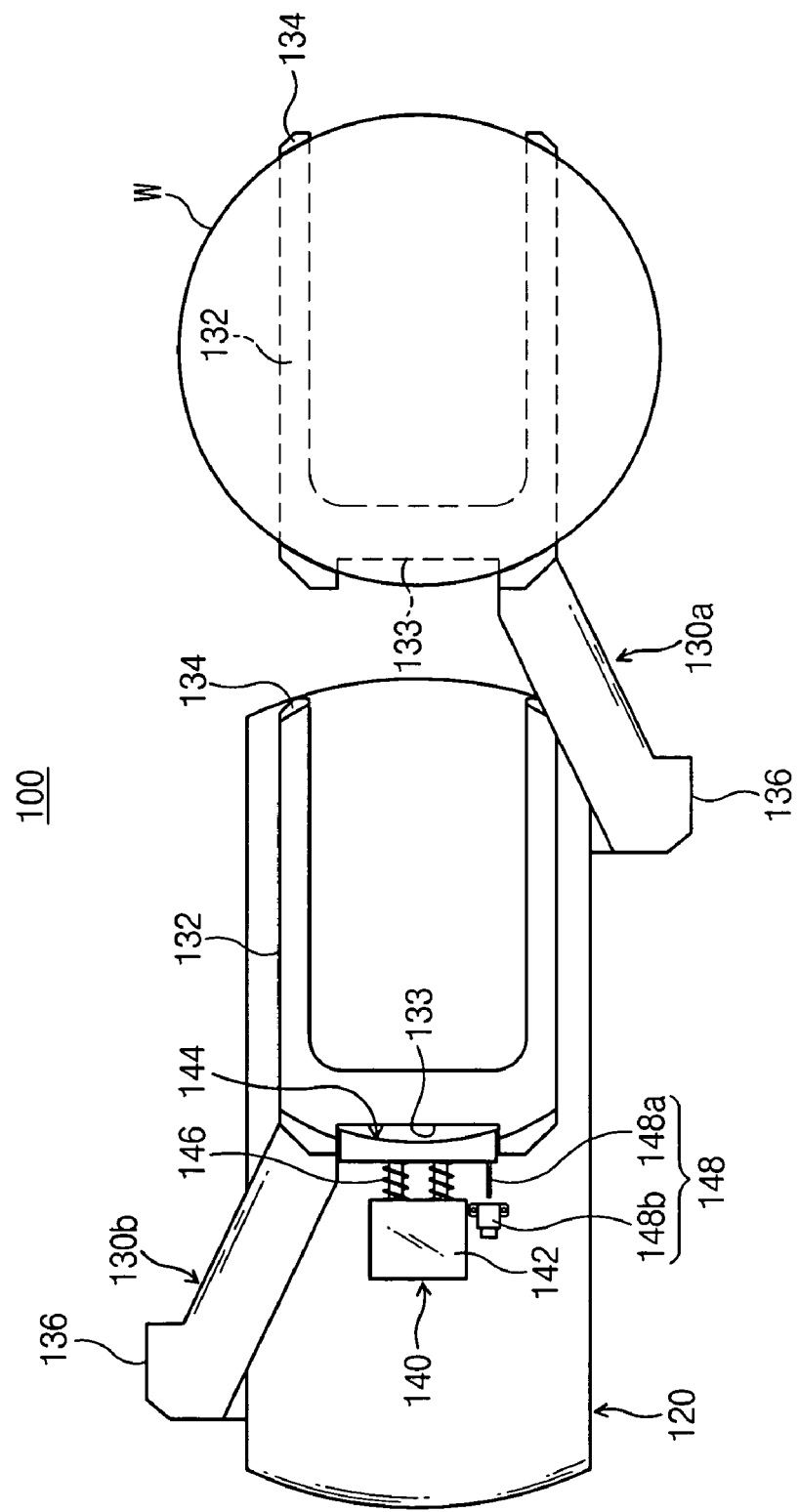

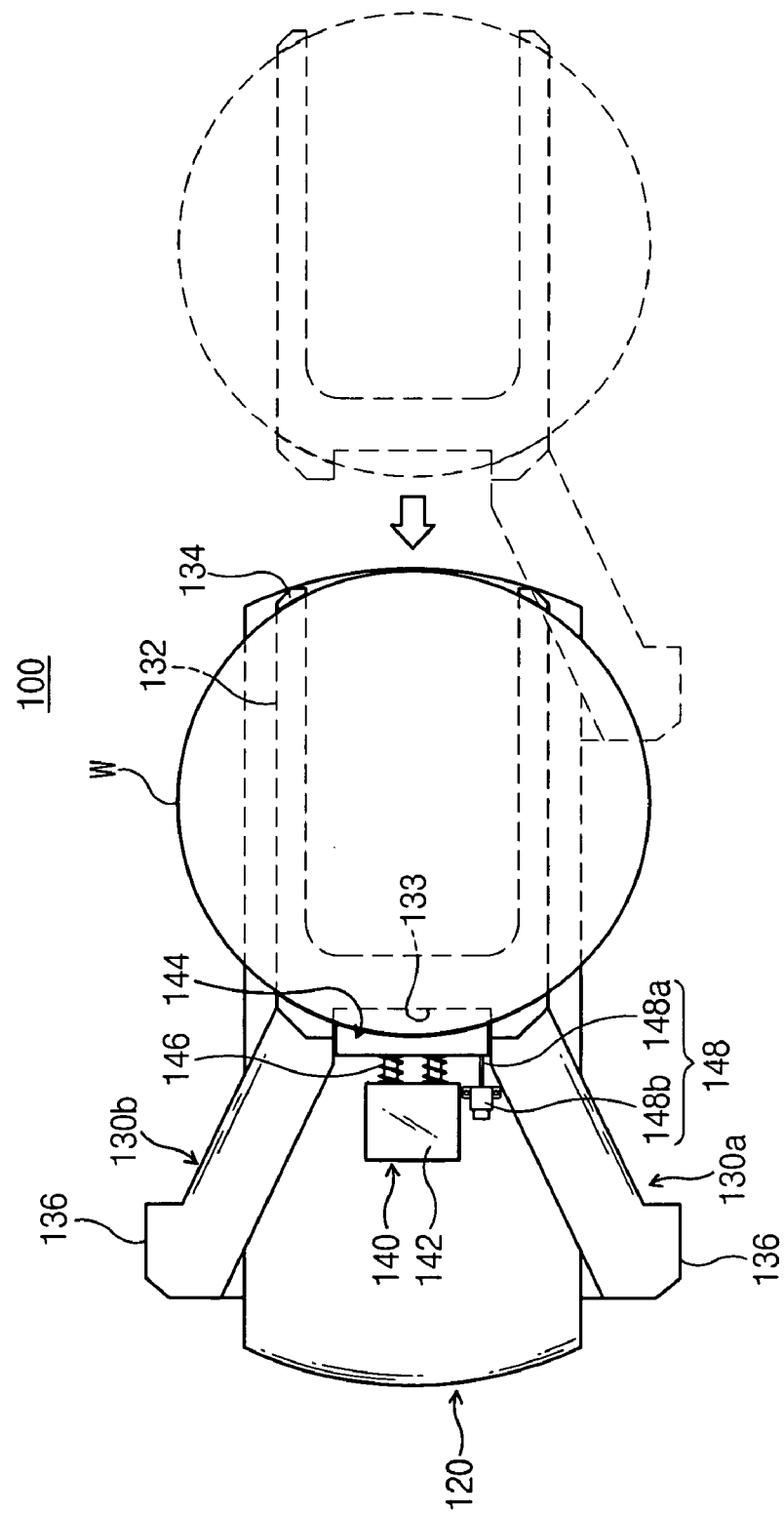

SUBSTRATE TRANSPORT APPARATUS

PRIORITY STATEMENT

This application claims priority of Korean Patent Application No. 2004-63502, filed on Aug. 12, 2004 in the Korean Intellectual Property Office, the disclosure of which is incorporated herein in its entirety by reference.

BACKGROUND OF THE INVENTION

1. Field of the Invention

The present invention relates to a substrate transport apparatus and, more particularly, to a substrate transport apparatus for stably transporting a substrate and sensing a receiving state of the substrate.

2. Description of Related Art

During cleaning, submerging, depositing, and etching processes, a substrate must be transported to the respective processing positions. It is achieved by a substrate transport apparatus. A substrate transport apparatus is a robotic and automated apparatus that operates with a predetermined program to transport a substrate to respective processing positions.

A typical substrate transport apparatus has a thin-plate hand on which a substrate is placed. Corbels are formed at the hand for preventing separation of a substrate while transporting the substrate. Since the substrate transport apparatus simply transports a substrate placed on the hand, the substrate slides on the hand when being transported at a high speed.

As a result, a substrate transport speed of a substrate transport apparatus must be enhanced for raising a productivity of a semiconductor manufacturing equipment. Nonetheless, corbels formed at a hand are incapable of preventing a substrate from sliding out of the hand in spite of inertial force caused by a high transport speed of the substrate transport apparatus. In a conventional substrate transport apparatus using a reflective optical sensor to check whether a substrate exists, the reflective optical sensor does not often sense a substrate according to a notch or flat-zone position of the substrate.

As previously stated, a conventional substrate transport apparatus is not capable of preventing a substrate from sliding out when transporting the substrate. Due to the sliding of the substrate, the apparatus is not capable of transporting a substrate at a high speed. This results in decrease of a productivity.

SUMMARY OF THE INVENTION

A feature of the present invention is to provide a substrate transport apparatus for gripping a substrate on a hand without use of a driver.

Another feature of the present invention is to provide a substrate transport apparatus for tightly grapping a substrate on a hand at a maximum substrate transport speed.

Another feature of the present invention is to provide a substrate transport apparatus for checking whether a substrate exists and a grip state irrespective of a notch or flat-zone position of the substrate and sensing a substrate even when it is turned.

In order to achieve these features, the present invention a substrate transport apparatus including a base, at least one hand having a pocket part on which a substrate is placed and moving from a position of a groove formed on the base to a substrate pickup position, and at least one grip member for gripping a substrate placed on the pocket part of the hand when the least one hand returns to the position of the groove from the substrate pickup position.

In some embodiments of the present invention, the grip member includes a pusher and an elastic member. The pusher has a curved section contacting the edge of a substrate and is mounted on the base to move in the same direction as the at least one hand. The elastic member supplies an elastic force for enabling the pusher to laterally press the edge of the substrate.

In some embodiments of the present invention, the grip member includes a check bar connected to the pusher and a substrate sensing member including a sensor for sensing whether the check bar moves.

In some embodiments of the present invention, the curve section is wider than a flat-zone of the substrate.

In some embodiments of the present invention, the pocket part has an open cutting where the pusher of the grip member is disposed when the at least one hand returns to the groove position. The edge of the substrate is partially disposed at the open cutting.

In some embodiments of the present invention, the substrate transport apparatus further includes a light receiving sensor and a light emitting sensor for sensing a receiving state of a substrate placed on the pocket part of the at least one hand. The light receiving sensor is disposed on an inner base of the edge of the substrate, and the light emitting sensor is disposed on an outside of the edge of the substrate to be diagonally turned to the light receiving sensor.

In some embodiments the base includes a driver installed therein to move the at least one hand. A rotation and a height of the base are controllable.

BRIEF DESCRIPTION OF THE DRAWINGS

FIG. 6A shows that a first hand moves to a pickup position.

FIG. 6B shows that the first hand moves to a home position.

DETAILED DESCRIPTION OF THE INVENTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

In embodiments of the present invention, a substrate transport apparatus having tow hands will be described. Alternatively, the substrate transport apparatus may have only one hand.

Figure 1:
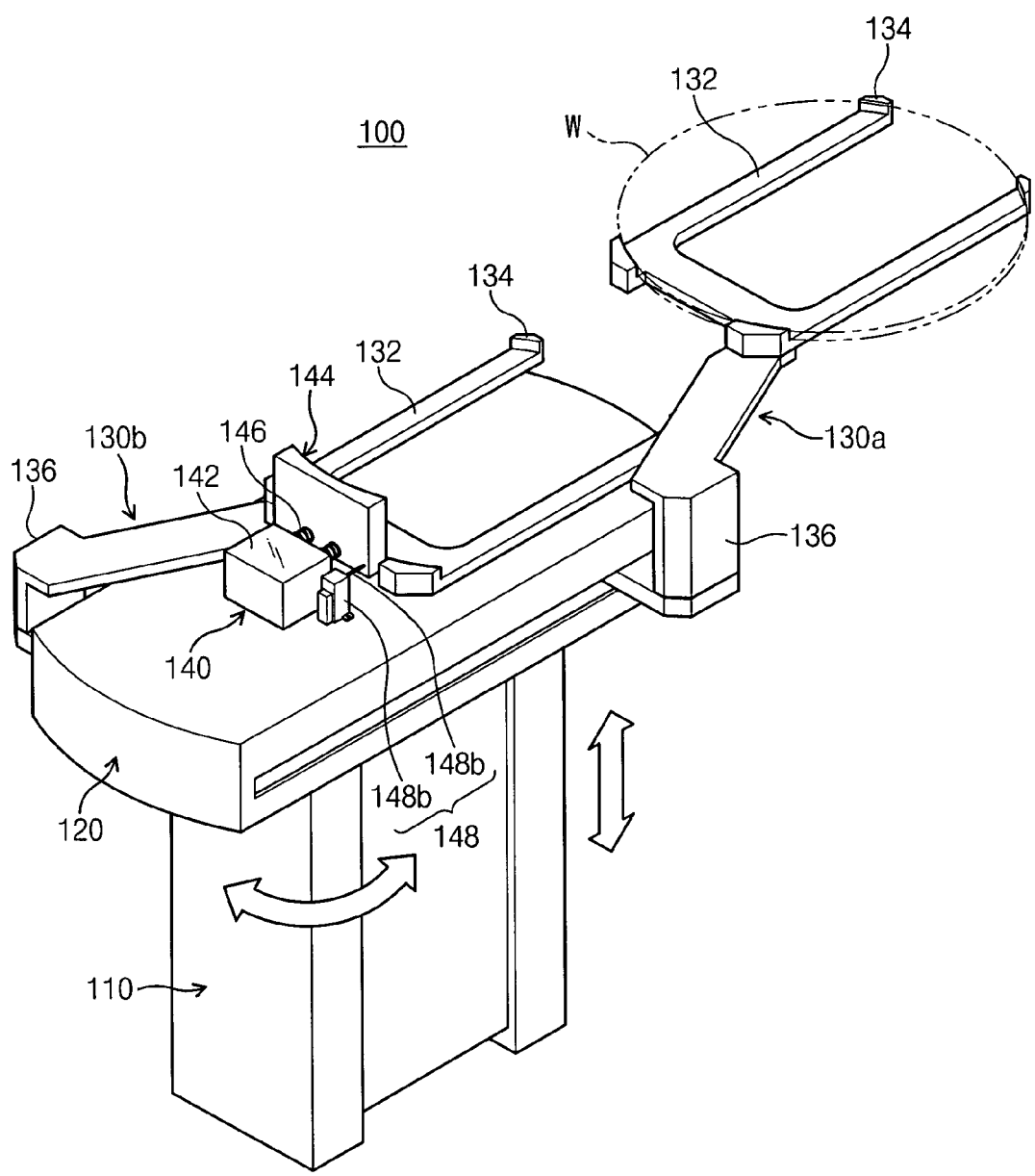
FIG. 1 is a perspective view of a substrate transport apparatus according to the present invention.
Figure 2:
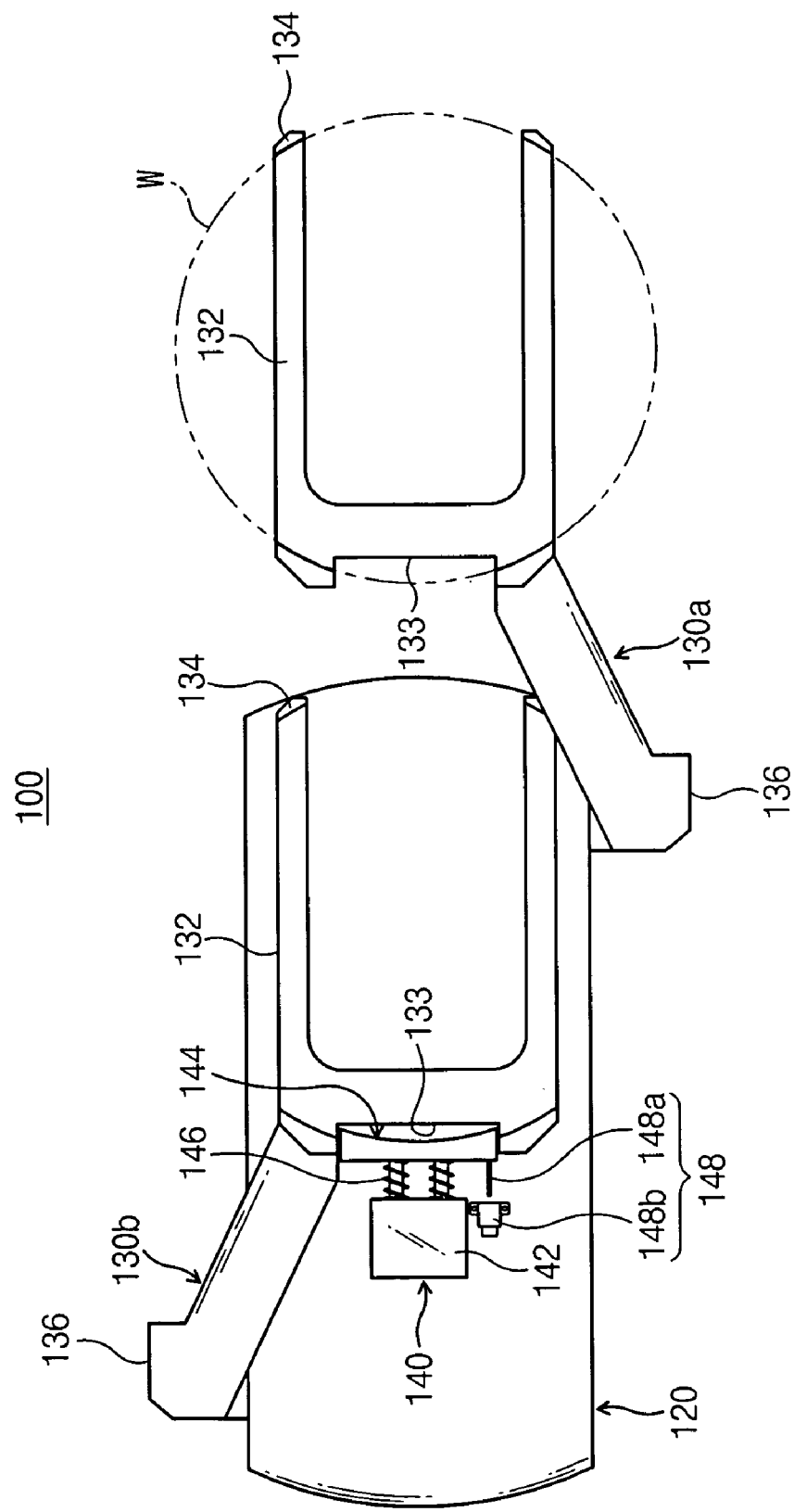
FIG. 2 is a top plan view of the substrate transport apparatus shown in FIG. 1.
Figure 3:
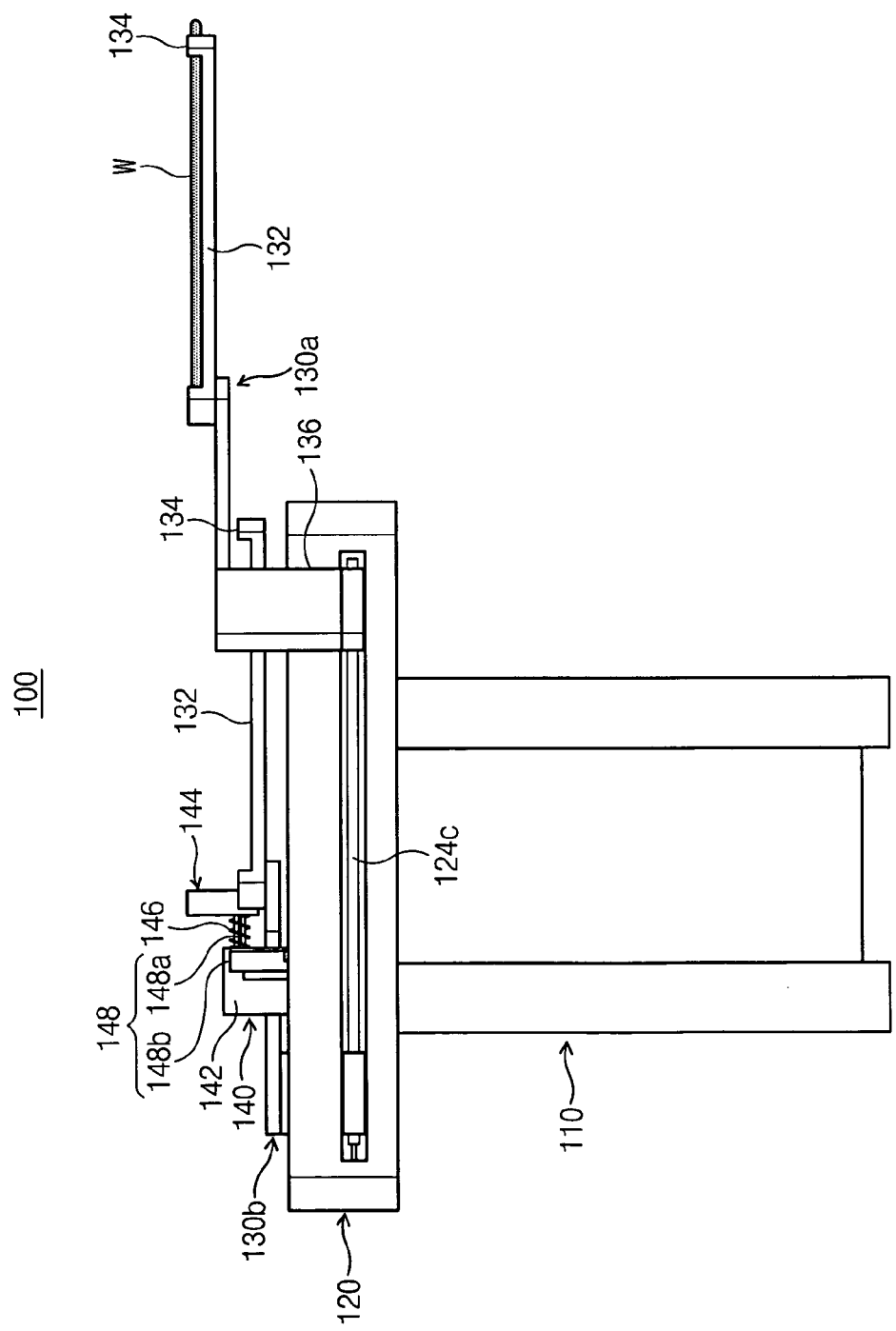
FIG. 3 is a side view of the substrate transport apparatus shown in FIG. 1.

Referring to FIG. 1 and FIG. 2, a substrate transport apparatus 100 includes a body 110, a based 120 installed at an upper portion of the body 110, first and second hands 130a and 130b moving in forward and backward directions, and a grip member 140 for gripping a substrate W placed on the first and second seconds 130a and 130b. For example, the base 120 may rotate on the body 110 and a height of the base 120 may be controlled.

The substrate transport apparatus 100 has, for example, two hands for a replacement operation. One of the two hands serves to bring a completely treated substrate from a treat unit, and the other hand serves to take an untreated substrate to the treat unit.

The first and second hands 130a and 130b may independently move back and forth at different heights. In this embodiment, the first hand 130a is disposed to be higher than the second hand 130b. Each of the hands 130a and 130b has a pocket part 132 on which a substrate is placed and a connecting arm 136 that extends along one side of the pocket part 132 and is connected to a driver installed in the base 120. The pocket part 132 has a shape of "⊃" but may have various other shapes. Four corbels 134 are formed at four corners of the pocket part 132 for preventing separation of a substrate.

The substrate transport apparatus 100 is picked up while the first hand 130a or the second hand 130b moves forward (pickup position) and transported while it moves backward (groove position). As illustrated in FIG. 2, the first hand 130a is located at the pickup position and the second hand 130b is located at the groove position.

Figure 4:
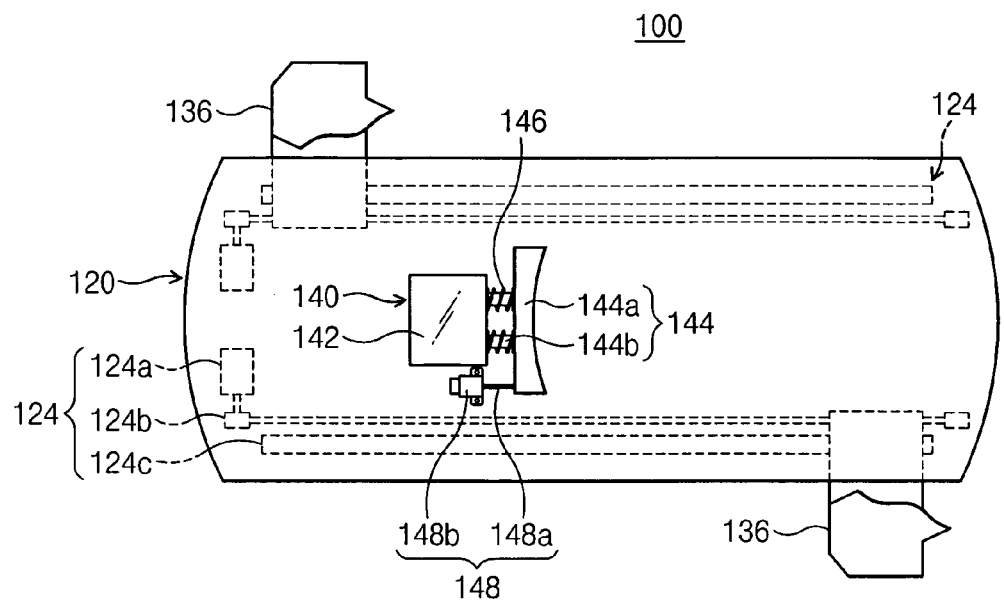
FIG. 4 shows a driver unit installed at a base.

Referring to FIG. 4, movement of the first and second hands 130a and 130b is done by means of two drivers 124 installed in the base 120. The driver 124 may include a motor 124a, a belt pulley 124b for sending a power of the motor 124a to the first hand 130a or the second hand 130b, and a guide rail 124c for guiding a back-and-forth movement of the first hand 130a or the second hand 130b, which are simply illustrated in FIG. 4. Undoubtedly, the driver 124 may be another component such as a cylinder.

Figure 5:
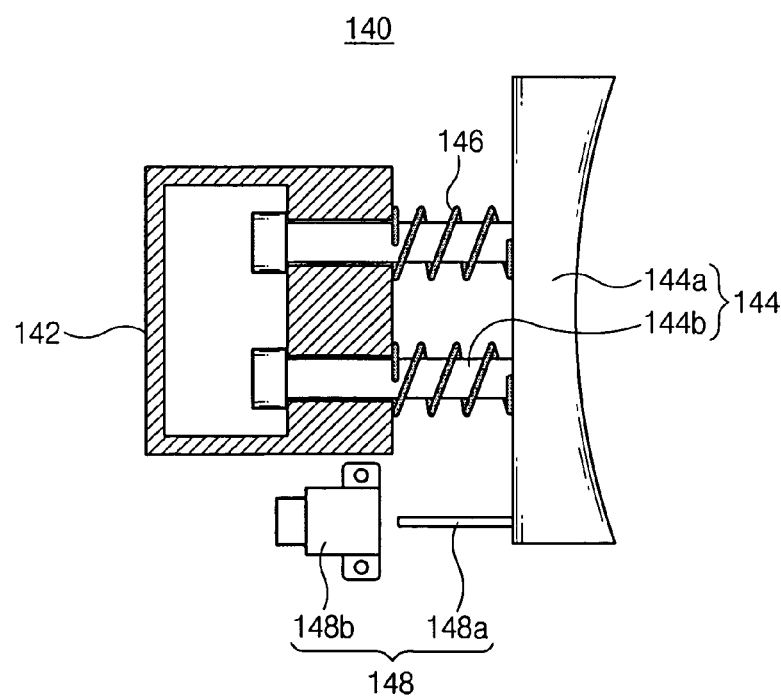
FIG. 5 shows a grip member installed at the base.

Referring to FIG. 2 and FIG. 5, the grip member 140 plays a roles in stably gripping a substrate placed on the pocket part 132 when the first hand 130a or the second hand 130b returns from the pickup position to the groove position. The grip member 140 includes a fixed block 142, a pusher 144, and a compressive spring 146. The pusher 144 is installed at the fixed block 142 to be slidable back and forth in the same direction as the second hand 130b. The pusher 144 has a curved section 144a that is in direct contact with the edge of the substrate and two connecting rods 144b connected to the fixed block 142. The compressive spring 146 is installed at the connecting rod 144b to provide an elastic force for enabling the pusher 144 to laterally press the edge of the substrate. The pusher 144 grips the edge of the substrate using an elastic repulsive force of the compressive spring 146. Preferably, the curved section 144a of the pusher 144 is wider than an existing flat-zone. The pocket part 132 of the respective first and second hands 130a and 130b has an open cutting 133 where the pusher 144 of the grip member 140 is disposed. The edge of the substrate is partially disposed at the open cutting 133.

Figure 11:
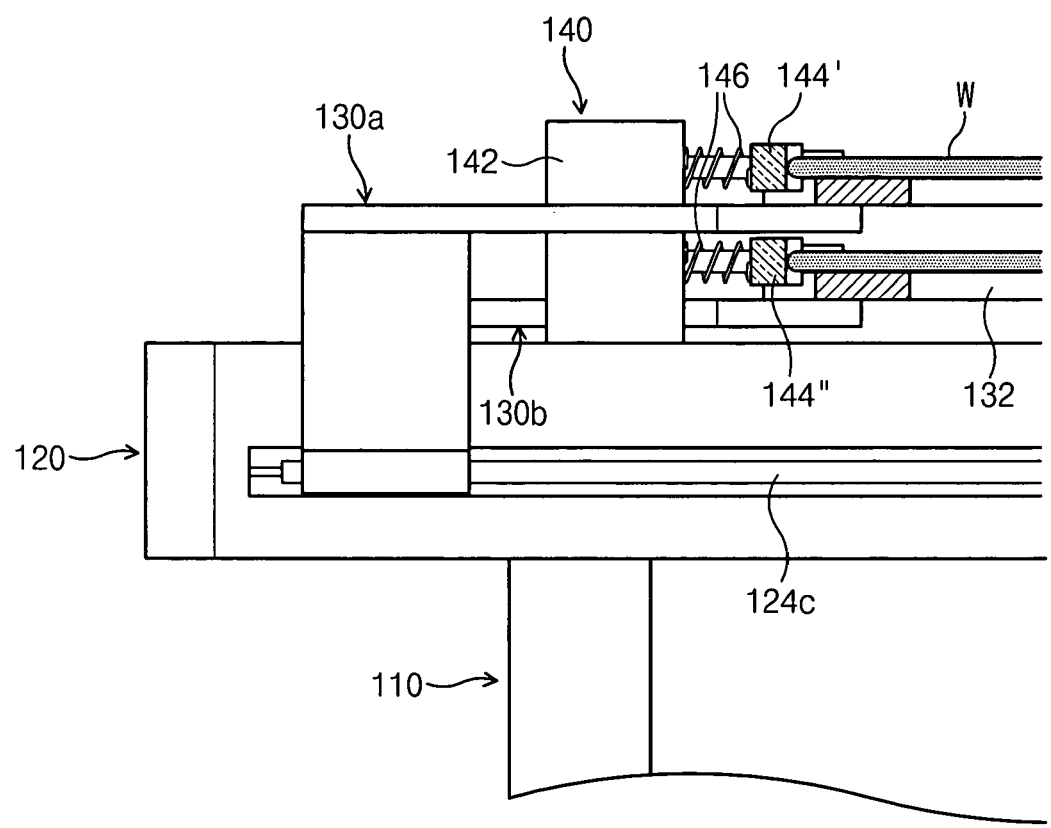
FIG. 11 shows a grip member having two pushers.

As described above, the grip member 140 has a single pusher for gripping both substrates of first and second hands. Alternatively, the grip member 140 may have a pusher 144' for a first hand and a pusher 144" for a second hand, as illustrated in FIG. 11.

Since the grip member 140 dose not grip the edge of a substrate using an extra driver such as a cylinder, an error caused by a malfunction of the driver does not arise and a fabricating cost is reduced.

The grip member 140 further includes a substrate sensing member 148 for sensing whether a substrate W is placed on a first hand or a second hand. The substrate sensing member 148 includes a check bar 148a connected to the rear end of the pusher 144 and a sensor 148b for sensing the check bar 148b. As illustrated in FIG. 6A and FIG. 6B, if the substrate W is normally disposed on a first hand 130a or a second hand 130b and the first hand 130a moves to a groove position, the pusher 144 is pushed back while being in contact with the edge of the substrate. At this time, the check bar 148a moves back with the pusher 144 and the sensor 148b senses the end of the check bar 148a to be turned on.

Figure 7A:
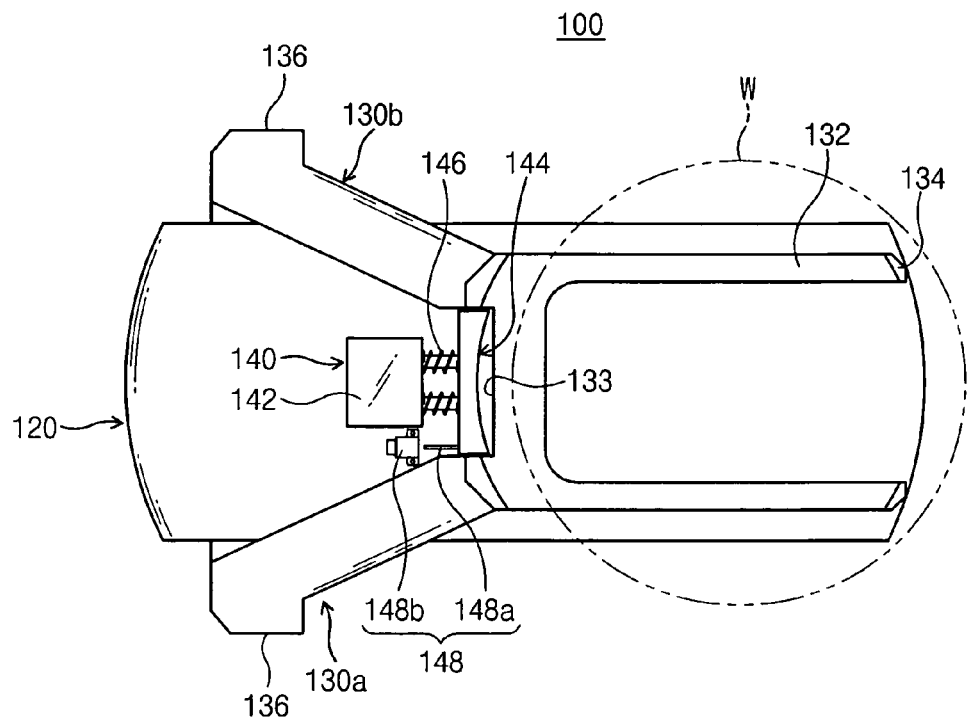
FIG. 7A through FIG. 7C show that a substrate is mislocated.
Figure 7B:
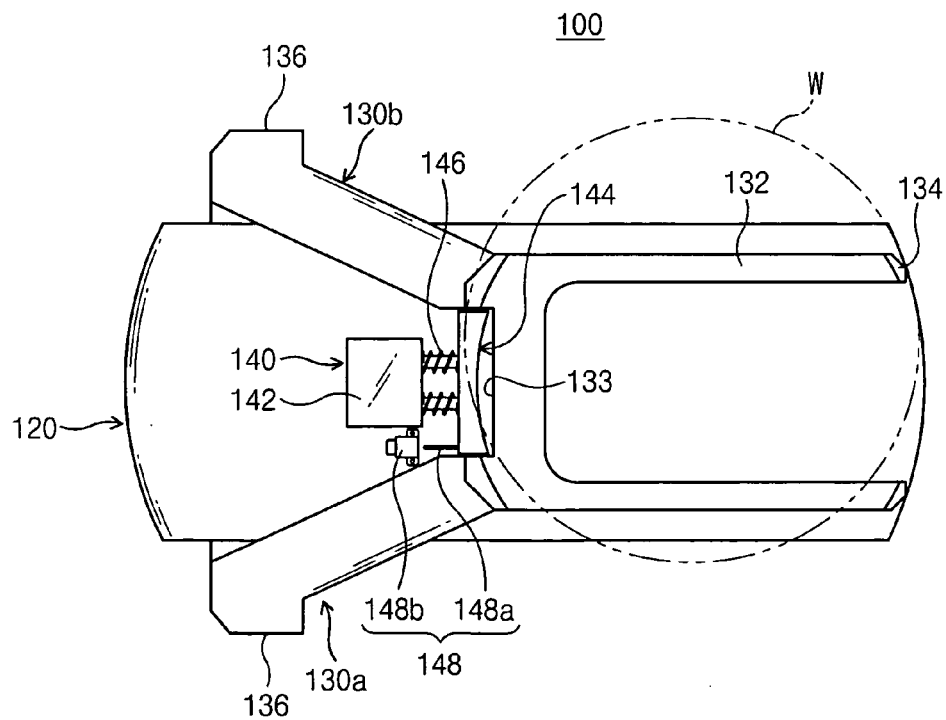
Figure 7C:
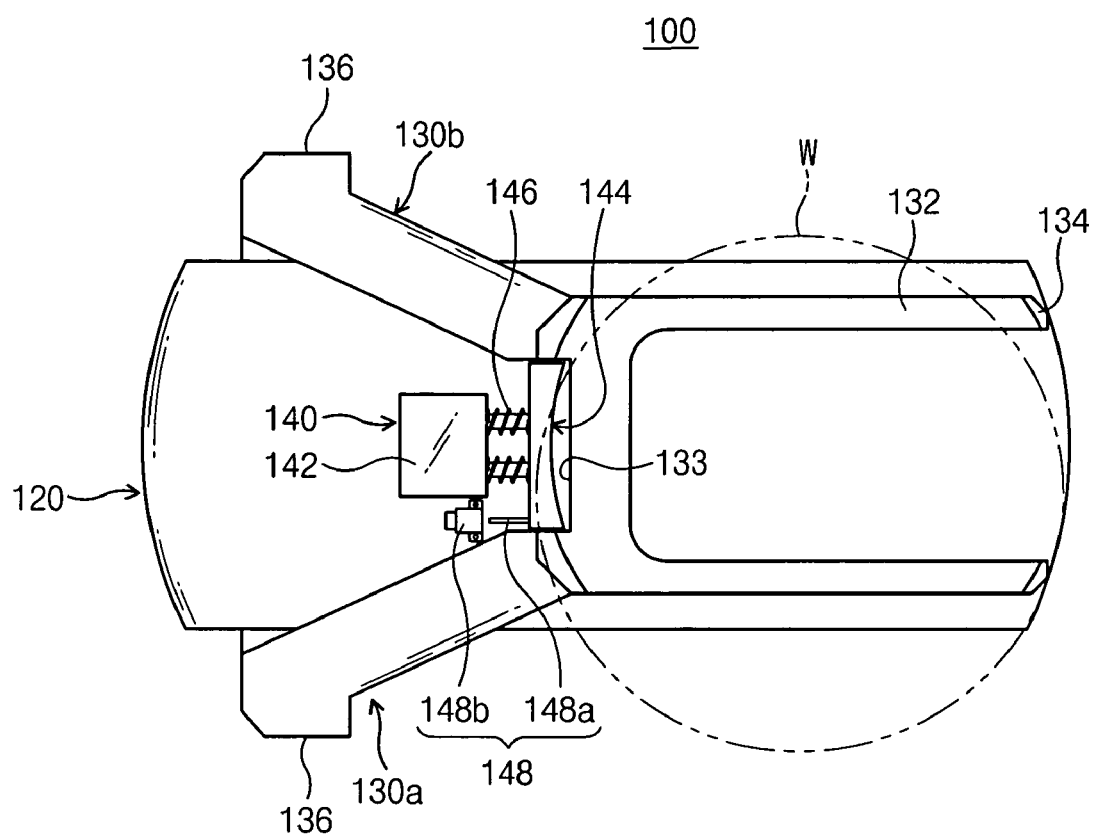

As illustrated in FIG. 7A through FIG. 7C, if a substrate W rides on a corbel 134 of a pocket part 132 or is disposed at one side, a pusher 144 of the grip member 140 is not pushed back. Thus, the sensor 148b is turned off. In this case, the sensor senses that there is no substrate or a grip miss state of the substrate to ring the alarm and stop a process.

Figure 8A:
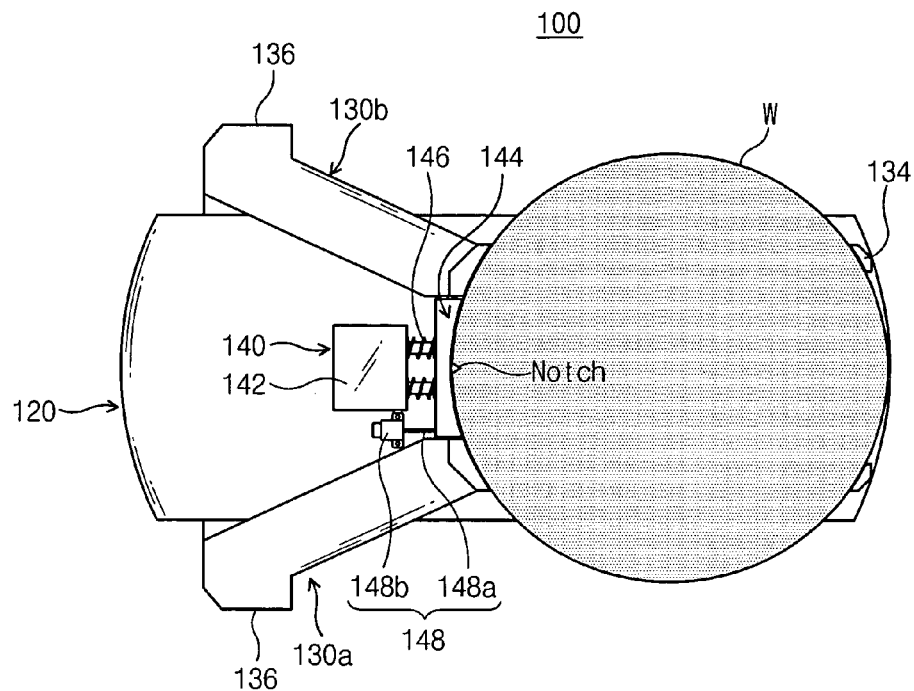
FIG. 8A and FIG. 8B show that a notch and a flat-zone of a substrate W move toward a pusher.
Figure 8B:
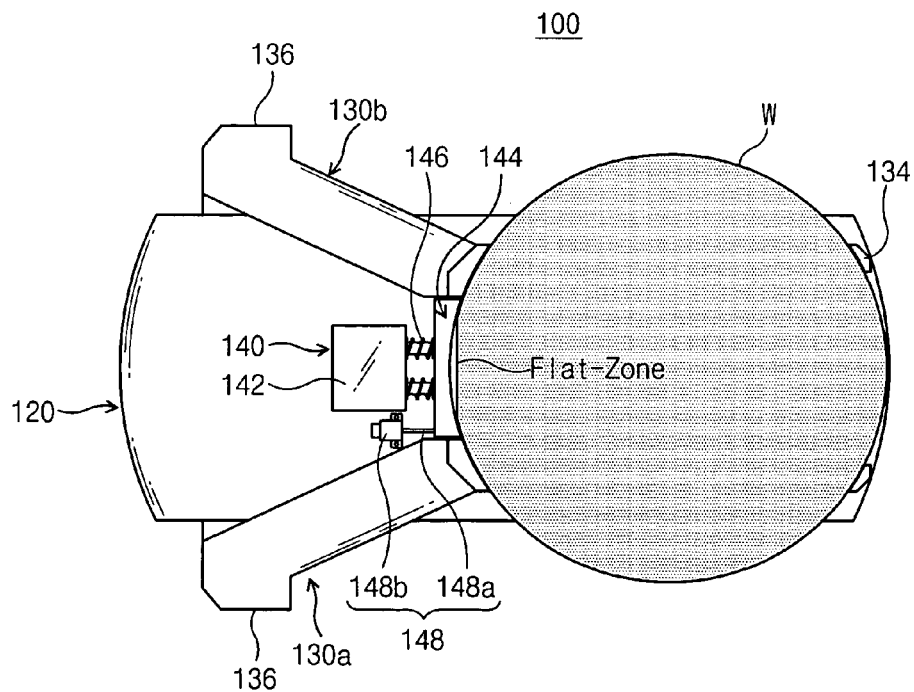

As illustrated in FIG. 8A and FIG. 8B, if a notch and a flat-zone of a substrate W face the pusher 144, a pusher 144 is pushed back because the pusher 144 is wider than the flat-zone. Thus, the sensor 148b is turned on to check whether a substrate exists and a grip state of the substrate.

As described above, the substrate transport apparatus according to the invention senses a substrate, without using a plurality of optical sensors for sensing the substrate, depending on whether a pusher moves. Thus, it is possible to prevent a malfunction caused by positions of notch and flat-zone of a substrate.

Figure 9:
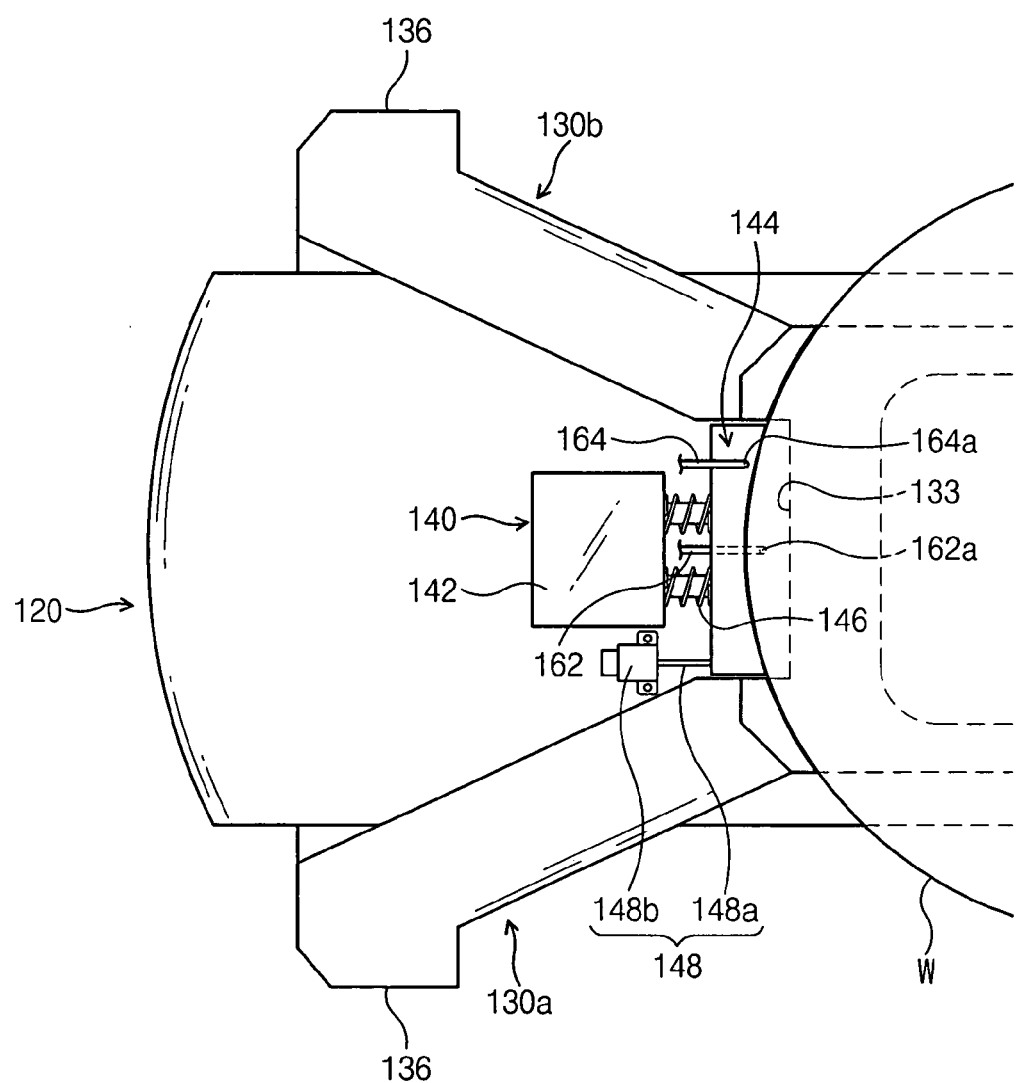
FIG. 9 and FIG. 10 show a substrate transport apparatus having a light receiving sensor and a light emitting sensor for sensing a substrate according to the present invention.
Figure 10:
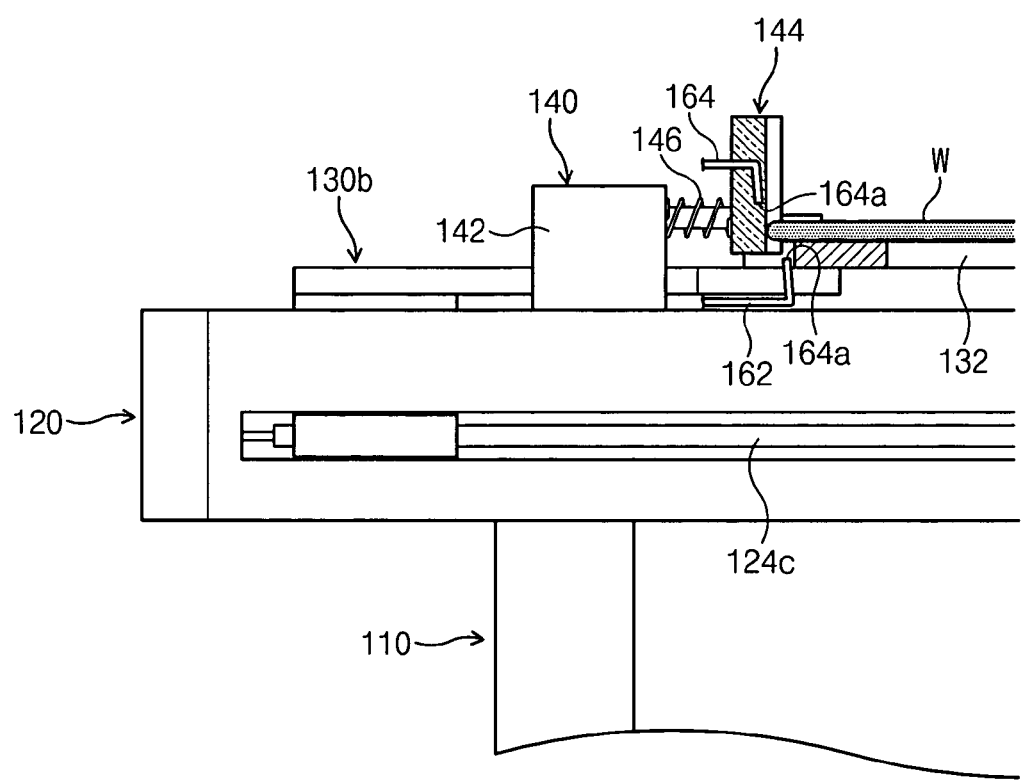

As illustrated in FIG. 9 and FIG. 10, the substrate transport apparatus according to the invention includes a light receiving sensor 162 and a light emitting sensor 164 for sensing a substrate more minutely, which are all transmission fiber sensors. Referring to FIG. 9, the end (light receiving face) 162a of the light receiving sensor 162 is disposed inside the edge of a substrate and the end (light emitting face) 164a of the light emitting sensor 164 is disposed outside the substrate. Referring to FIG. 10, the end 162a of the light receiving sensor 162 is disposed below a substrate and the end 164a of the light emitting sensor 164 is disposed over the substrate. Particularly, the light emitting sensor 164 is not collinearly disposed with the light receiving sensor 162, as illustrated in FIG. 9. That is, a light transmission pathway of the light receiving sensor 162 and the light emitting sensor 164 is diagonally turned to sense the edge of the substrate.

To sum up, the present invention has advantages as follows.

Since the edge of a substrate is not gripped using an extra driver such as a cylinder, an error caused by a malfunction of the driver does not arise and a fabricating cost is reduced. The substrate transport apparatus according to the invention senses a substrate, without using a plurality of optical sensors for sensing the substrate, depending on whether a pusher moves. Thus, it is possible to prevent a malfunction caused by positions of notch and flat-zone of a substrate. Locations of a light receiving sensor and a light emitting sensor are altered to sense a substrate more minutely.

Other modifications and variations to the invention will be apparent to a person skilled in the art from the foregoing disclosure. Thus, while only certain embodiment of the invention has been specifically described herein, it will be apparent that numerous modifications may be made thereto without departing from the spirit and scope of the invention.

What is claimed is:

1. A substrate transport apparatus comprising:

a base;

at least one hand having a pocket part on which a substrate is placed and moving from a first position at one end of a groove disposed in the base ("groove position") to a second position at the other end of the groove ("substrate pickup position");

at least one grip member for gripping the substrate placed on the pocket part of the hand when the at least one hand returns to the groove position from the substrate pickup position; and a light receiving sensor and a light emitting sensor for sensing a receiving state of the substrate placed on the pocket part of the at least one hand.

2. The substrate transport apparatus of claim 1, wherein the grip member comprises:

a pusher having a curved section contacting the edge of the substrate and mounted on the base to move in the same direction as the at least one hand; and an elastic member for supplying an elastic force to enable the pusher to laterally press the edge of the substrate, wherein the pusher automatically grips the edge of the substrate placed on the at least one hand returning to the groove position.

3. The substrate transport apparatus of claim 2, wherein the grip member comprises:

a check bar connected to the pusher; and a substrate sensing member including a sensor for sensing whether the check bar moves.

4. The substrate transport apparatus of claim 2, wherein the curve section is wider than a flat-zone of the substrate.

5. The substrate transport apparatus of claim 2, wherein the pocket part has an open cutting where the pusher of the grip member is disposed when the at least one hand returns to the groove position, the edge of the substrate being partially disposed at the open cutting.

6. The substrate transport apparatus of claim 5, wherein the light receiving sensor is disposed in a central portion of the pusher such that the end of the light receiving sensor is beneath the edge of the substrate and the light emitting sensor is disposed in an end portion of the pusher to be outside the edge of the substrate, the light emitting sensor being diagonally turned to the light receiving sensor.

7. The substrate transport apparatus of claim 1, wherein the base includes a driver which moves the at least one hand, the base being rotatable and the height of the base being adjustable.

8. A substrate transport apparatus comprising:

abase;

at least one hand having a pocket part on which a substrate is placed and moving from a first position at one end of a groove disposed in the base ("groove position") to a second position at the other end of the groove ("substrate pickup position");

a pusher having a curved section contacting the edge of the substrate and mounted on the base to move in the same direction as the at least one hand; and an elastic member for supplying an elastic force to enable the pusher to laterally press the edge of the substrate, wherein the pusher automatically grips the edge of the substrate placed on the at least one band returning to the groove position; and at least one grip member for gripping the substrate placed on the pocket part of the hand when the at least one hand returns to the groove position from the substrate pickup position, the at least one grip member including a check bar connected to the pusher and a substrate sensing member including a sensor for sensing whether the check bar moves.

9. A substrate transport apparatus comprising:

a base;

at least one hand having a pocket part on which a substrate is placed and moving from a first position at one end of a groove disposed in the base ("groove position") to a second position at the other end of the groove ("substrate pickup position");

at least one grip member for gripping the substrate placed on the pocket part of the hand when the at least one hand returns to the groove position from the substrate pickup position; and a pusher of the at least one grip member having a curved section contacting the edge of the substrate and mounted on the base to move in the same direction as the at least one hand, the pusher being disposed in an open cutting of the pocket part when the at least one hand returns to the groove position, whereby the edge of the substrate is partially disposed at the open cutting; and an elastic member for supplying an elastic force to enable the pusher to laterally press the edge of the substrate, wherein the pusher automatically grips the edge of the substrate placed on the at least one hand returning to the groove position.

* * * * *